(12) United States Patent
Wang et al.

(10) Patent No.: US 9,513,414 B2
(45) Date of Patent: Dec. 6, 2016

(54) METHOD FOR REPAIRING DISPLAY SUBSTRATE, DISPLAY SUBSTRATE AND DISPLAY APPARATUS

(71) Applicants: BOE Technology Group Co., Ltd., Beijing (CN); Beijing BOE Display Technology Co., Ltd., Beijing (CN)

(72) Inventors: Xu Wang, Beijing (CN); Ye Wang, Beijing (CN); Wenfu Zhang, Beijing (CN); Hongtao Dong, Beijing (CN)

(73) Assignees: BOE Technology Group Co., Ltd., Beijing (CN); Beijing BOE Display Technology Co., Ltd., Beijing (CN)

( * ) Notice: Subject to any disclaimer, the term of this patent is extended or adjusted under 35 U.S.C. 154(b) by 0 days.

(21) Appl. No.: 14/314,401

(22) Filed: Jun. 25, 2014

(65) Prior Publication Data

US 2015/0301240 A1     Oct. 22, 2015

(30) Foreign Application Priority Data

Apr. 18, 2014    (CN) .......................... 2014 1 0157713

(51) Int. Cl.
   *H01L 29/80*      (2006.01)
   *G02B 5/20*       (2006.01)
   (Continued)

(52) U.S. Cl.
   CPC ......... *G02B 5/201* (2013.01); *G02F 1/136259* (2013.01); *H01L 27/1262* (2013.01); *H01L 27/1296* (2013.01); *H01L 33/58* (2013.01)

(58) Field of Classification Search
   CPC .. H01L 27/1262; H01L 33/58; H01L 27/1296; G02F 1/136259; G02F 1/1309; G02F 1/136209; G02F 1/133512; G02F 349/192
   See application file for complete search history.

(56) References Cited

U.S. PATENT DOCUMENTS

| | | | |
|---|---|---|---|
| 5,531,881 A | | 7/1996 | Matsumura et al. |
| 6,035,526 A | * | 3/2000 | Saruta ................... G02B 5/201 |
| | | | 219/121.13 |

(Continued)

FOREIGN PATENT DOCUMENTS

| | | |
|---|---|---|
| CN | 101846827 A | 9/2010 |
| CN | 102626829 A | 8/2012 |

(Continued)

OTHER PUBLICATIONS

First Office Action, including Search Report, for Chinese Patent Application No. 201410157713.9, dated Feb. 26, 2016, 11 pages.

(Continued)

*Primary Examiner* — Daniel Luke
*Assistant Examiner* — Khatib Rahman
(74) *Attorney, Agent, or Firm* — Westman, Champlin & Koehler, P.A.

(57) ABSTRACT

A method for repairing a display substrate, comprising steps of: forming a black matrix pattern on a substrate, wherein there is a first pattern missing region in the black matrix pattern; forming a color filter layer pattern on the substrate on which the black matrix pattern is formed; removing all patterns from the substrate within the first pattern missing region by laser processing the first pattern missing region of the substrate based on a position of the first pattern missing region; and filling a first repair material into the first pattern missing region of the substrate processed by laser so as to repair the first pattern missing region. The present invention also discloses a display substrate and a display apparatus.

6 Claims, 3 Drawing Sheets

(51) Int. Cl.
  *H01L 27/12* (2006.01)
  *H01L 33/58* (2010.01)
  *G02F 1/1362* (2006.01)

(56) References Cited

U.S. PATENT DOCUMENTS

| | | | | |
|---|---|---|---|---|
| 8,273,423 B2 * | 9/2012 | Yoshioka | ............... | G02B 5/201 |
| | | | | 347/106 |
| 2004/0130606 A1 * | 7/2004 | Tawaraya | ............. | C09D 11/101 |
| | | | | 347/100 |

FOREIGN PATENT DOCUMENTS

| CN | 103091878 A | 5/2013 |
|---|---|---|
| JP | H07-270609 A | 10/1995 |
| JP | 2006-106524 A | 4/2006 |
| JP | 2012-118444 A | 6/2012 |

OTHER PUBLICATIONS

Second Office Action for Chinese Patent Application No. 201410157713.9, dated Jul. 12, 2016, 10 pages.

\* cited by examiner

METHOD FOR REPAIRING DISPLAY SUBSTRATE, DISPLAY SUBSTRATE AND DISPLAY APPARATUS

CROSS-REFERENCE TO RELATED APPLICATION

This application claims the benefit of Chinese Patent Application No. 201410157713.9 filed on Apr. 18, 2014 in the State Intellectual Property Office of China, the whole disclosure of which is incorporated herein by reference.

BACKGROUND OF THE INVENTION

Field of the Invention

The present invention relates to a display technology field, more particularly, relates to a method for repairing a display substrate, a display substrate and a display apparatus manufactured by the method.

Description of the Related Art

Generally, during manufacturing a color filter substrate, a black matrix pattern, a color filter layer pattern and the like are formed on a substrate in this order by a patterning process. After the black matrix pattern is formed by the patterning process, it needs to detect the formed black matrix pattern to determine whether there is a missing region (the missing region means a region where the black matrix pattern should be formed but is missing) or a redundant region (the redundant region means a region where the black matrix pattern should not be formed but is formed) in the black matrix pattern. If there is the missing region in the black matrix pattern, it causes a problem of leakage of light in a display panel. If there is the redundant region in the black matrix pattern, it reduces the aperture ratio of the display panel. The above conditions both disadvantageously affect the display quality of the display panel.

So far, in the prior art, after forming the black matrix pattern on the substrate by the patterning process, a method for repairing the missing region in the black matrix pattern generally comprises steps of: firstly, clearing the missing region 102 in the black matrix pattern 101 by laser, as shown in FIG. 1a; secondly, dropping a black photoresist 103 in the missing region 102 of the black matrix pattern 101, as shown in FIG. 1b; thirdly, clearing a redundant portion of the black photoresist 103 spreaded into an aperture region of the substrate by laser, as shown in FIG. 1c, that is, clearing the redundant black photoresist within shadowed regions indicated by oblique lines; finally, obtaining the repaired black matrix pattern 101, as shown in FIG. 1d. Also, a method for repairing the redundant region in the black matrix pattern generally comprises a step of: directly clearing the redundant region of the black matrix pattern located in the aperture region of the substrate by laser. After the black matrix pattern has been repaired, subsequent processes, such as forming the color filter layer pattern, are performed.

The above method of repairing the missing region in the black matrix pattern is very complicated, because it needs twice laser clearing processes. Furthermore, the black photoresist dropped into the missing region is partly used to repair the missing region, and the redundant portion of the black photoresist beyond the missing region must be cleared by laser, wasting the photoresist. Moreover, surface of the black matrix pattern repaired by the above method is shaped like a spherical surface, causing the surface of the repaired black matrix pattern uneven, and decreasing the display quality of the display panel.

Accordingly, it becomes an urgent problem to be solved for those skilled in this art how to optimize the method of repairing the black matrix pattern in the color filter substrate.

SUMMARY OF THE INVENTION

The present invention has been made to overcome or alleviate at least one aspect of the above mentioned disadvantages.

According to an object of the present invention, there is provided an optimized method for repairing a display substrate capable of simplifying the repairing process, saving the cost and improving the display quality of a display panel.

According to an aspect of the present invention, there is provided a method for repairing a display substrate, comprising steps of:

forming a black matrix pattern on a substrate, wherein there is a first pattern missing region in the formed black matrix pattern;

forming a color filter layer pattern on the substrate on which the black matrix pattern is formed;

removing all patterns within the first pattern missing region from the substrate by laser processing the first pattern missing region of the substrate based on a position of the first pattern missing region; and filling a first repair material into the first pattern missing region of the substrate processed by laser so as to repair the first pattern missing region.

According to another aspect of the present invention, there is provided a display substrate is made by the above method.

According to another aspect of the present invention, there is provided a display apparatus comprising the above display substrate.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF PREFERRED EMBODIMENTS OF THE INVENTION

Figure 1A:
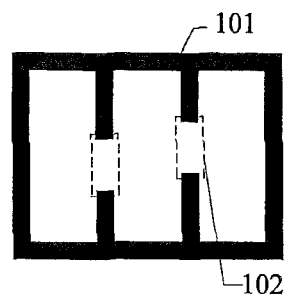
FIGS. 1a, 1b, 1c and 1d are illustrative views showing a process of repairing a missing region in a black matrix pattern formed on a color filter substrate in the prior art.
Figure 1B:
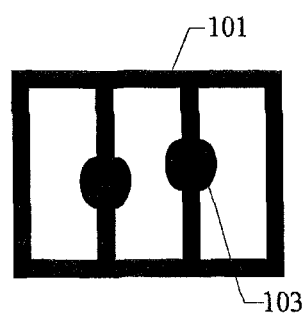
Figure 1C:
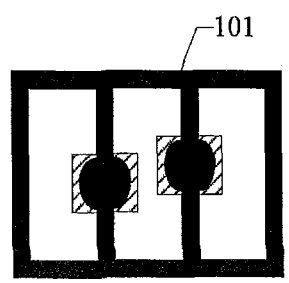
Figure 1D:
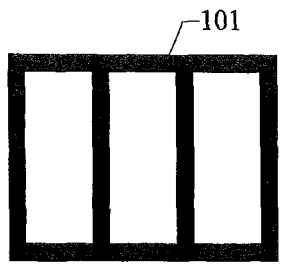

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

According to a general concept of the present invention, there is provided a method for repairing a display substrate, comprising steps of: forming a black matrix pattern on a substrate, wherein there is a first pattern missing region in the formed black matrix pattern; forming a color filter layer pattern on the substrate on which the black matrix pattern is formed; removing all patterns from the substrate within the first pattern missing region by laser processing the first pattern missing region of the substrate based on a position of the first pattern missing region; and filling a first repair material into the first pattern missing region of the substrate processed by laser so as to repair the first pattern missing region.

Figure 2:
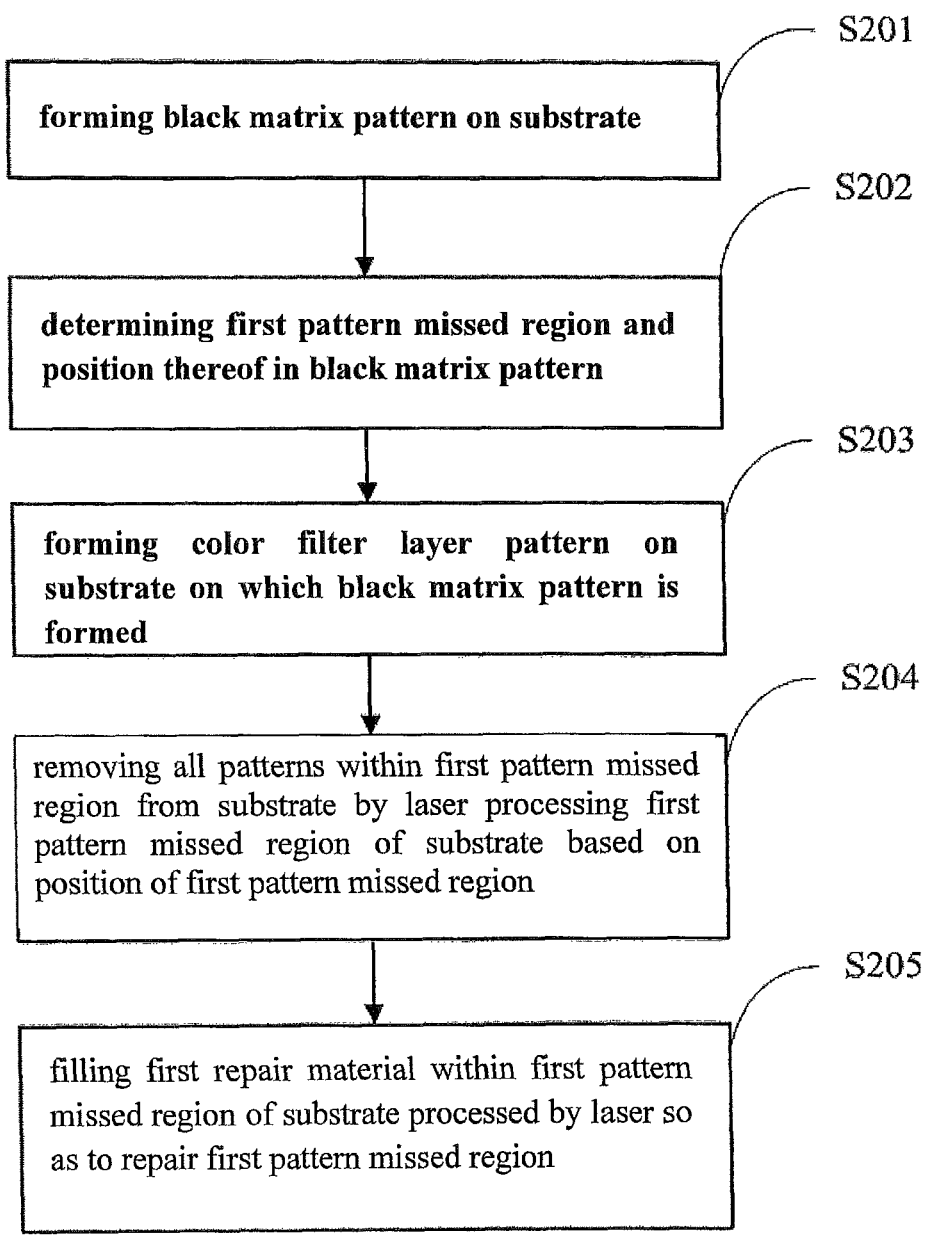
FIG. 2 is an flow chart of repairing a display substrate according to an exemplary embodiment of the present invention.

According to an exemplary embodiment of the present invention, as shown in FIG. 2, a method for repairing a display substrate mainly comprises steps of:

S201: forming a black matrix pattern on a substrate;

In an exemplary embodiment, the black matrix pattern is formed of a positive photoresist on the substrate by a patterning process. In this embodiment, firstly, a black matrix film and a photoresist film are formed on the substrate in this order; then, exposing and developing the photoresist film with a mask; thereafter, etching a portion of the black matrix film not covered by the photoresist; finally, peeling off the remained photoresist to obtain the black matrix pattern.

S202: determining a first pattern missing region and a position thereof in the black matrix pattern;

In an exemplary embodiment, after the black matrix pattern is formed on the substrate by the patterning process, detecting the formed black matrix pattern to determine the first pattern missing region and the position thereof in the black matrix pattern.

Figure 3A:
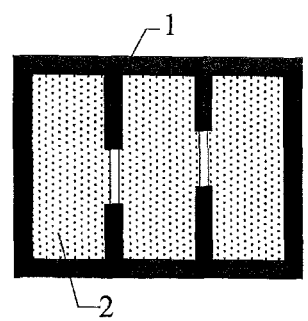
FIGS. 3a, 3b and 3c are illustrative views showing a process of repairing a missing region in a black matrix pattern formed on a display substrate according to an exemplary embodiment of the present invention.

S203: forming a color filter layer pattern 2 on the substrate on which the black matrix pattern 1 is formed, as shown in FIG. 3a;

In an exemplary embodiment, the color filter layer pattern 2 is formed regardless of the first pattern missing region in the black matrix pattern 1. Accordingly, it does not need to repair the first pattern missing region in the black matrix pattern 1 immediately after the black matrix pattern is formed on the substrate. Instead, the repairing of the first pattern missing region in the black matrix pattern 1 is performed after the color filter layer pattern is formed.

Furthermore, in an exemplary embodiment, after the step S201 of forming a black matrix pattern on a substrate is performed, the step S202 of determining a first pattern missing region and a position thereof in the black matrix pattern may be performed before or after the step S203 of forming a color filter layer pattern 2 on the substrate on which the black matrix pattern 1 is formed.

Figure 3B:
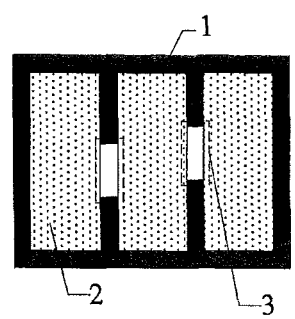

S204: removing all patterns from the substrate within the first pattern missing region 3 by laser processing the first pattern missing region 3 of the substrate based on the position of the first pattern missing region 3, as shown in FIG. 3b;

In this way, a preparation work for a subsequent step of filling a first repair material into the first pattern missing region of the substrate is finished so as to improve the repair quality by filling first repair material into the first pattern missing region of the substrate.

Figure 3C:
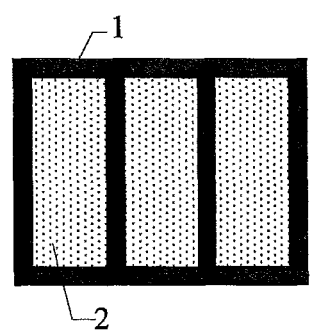

S205: filling the first repair material into the first pattern missing region 3 of the substrate processed by laser so as to repair the first pattern missing region 3, as shown in FIG. 3c;

In an exemplary embodiment, the first repair material may comprise any material adapted to form the black matrix pattern, for example, black photoresist or other suitable non-transparent material.

In the method according to the above exemplary embodiments of the present invention, the color filter layer pattern is made immediately after the black matrix pattern is formed on the substrate. Thereafter, the step of removing all patterns from the substrate within the first pattern missing region by laser processing the first pattern missing region of the substrate is performed. Then, the step of filling the first repair material into the first pattern missing region of the substrate processed by laser is performed. Thereby, the first repair material may be confined between two adjacent color barriers in the formed color filter layer pattern, and this prevents the first repair material from spreading into an aperture region of the substrate by properly controlling the filling amount of the first repair material. As a result, it not only eliminates the need for a step of removing the redundant first repair material spread into the aperture region of the display substrate by laser, but also reduces the usage amount of the first repair material. Also, the surface of the black matrix pattern repaired by the above method becomes very flat, improving the display quality of the display panel.

In an exemplary embodiment of the present invention, in order to repair all first pattern missing regions in the black matrix pattern, the above step S202 of determining a first pattern missing region and a position thereof in the black matrix pattern may comprise determining all the first pattern missing regions in the black matrix pattern and marking all the first pattern missing regions. In an exemplary embodiment, the positions of the first pattern missing regions may be detected by automatic optical inspection device and marked by a coordinate system set up by the automatic optical inspection device. Then, position information of the first pattern missing regions is recorded to generate a file, and the file containing the position information of the first pattern missing regions may be uploaded to a computer server.

In an exemplary embodiment, after reading out the file containing the position information of the first pattern missing regions, the first pattern missing regions in the black matrix pattern are repaired according to the marked position information of the first pattern missing regions in the same coordinate system. After the first pattern missing regions in the black matrix pattern are repaired, the file containing the position information of the first pattern missing regions is uploaded to the computer server again so as to add new detection information in the file in subsequent processes, ensuring the continuity of the position information of the first pattern missing regions.

In order to flatten the surface of the repaired first pattern missing region in the black matrix pattern and further improve the display quality of the display panel, in an exemplary embodiment of the present invention, it is necessary to ensure that the first repair material filled in the first pattern missing region has a thickness equal to or less than that of the black matrix pattern.

In an exemplary embodiment of the present invention, in order to prevent the black matrix pattern from covering the aperture region of the display panel and thus reducing the aperture ratio of the display panel, the above method may further comprise a step of determining a first pattern redundant region and the position thereof in the black matrix pattern before the step S203 of forming a color filter layer pattern on the substrate on which the black matrix pattern is formed and removing all patterns from the substrate within the first pattern redundant region by laser processing the first pattern redundant region of the substrate based on a position of the first pattern redundant region.

In an exemplary embodiment of the present invention, in order to further simplify the repairing process and save the repair time, during detecting the formed black matrix pattern, the step of determining the first pattern redundant region and the position thereof in the black matrix pattern is performed while determining the first pattern missing region and the position thereof in the formed black matrix pattern. That is, said detecting and marking the first pattern missing region in the black matrix pattern and said detecting and marking the first pattern redundant region in the black matrix pattern are simultaneously performed in one detection process.

In this case, the repairing of the first pattern redundant region is preformed before the step S203 of forming a color filter layer pattern on the substrate on which the black matrix pattern is formed. Thereby, the step of determining the first pattern redundant region and the position thereof in the black matrix pattern and the step S202 of determining a first pattern missing region and a position thereof in the black matrix pattern are preformed before the step S203 of forming a color filter layer pattern on the substrate on which the black matrix pattern is formed. That is, said detecting and marking the first pattern missing region in the black matrix pattern is performed before the color filter layer pattern is formed on the substrate.

In an exemplary embodiment of the present invention, after the step of forming a color filter layer pattern on the substrate on which the black matrix pattern is formed, the method may further comprise: determining a second pattern missing region and a position thereof in the color filter layer pattern and repairing the second pattern missing region based on the position of the second pattern missing region; and determining a second pattern redundant region and a position thereof in the color filter layer pattern and repairing the second pattern redundant region based on the position of the second pattern redundant region.

In an exemplary embodiment of the present invention, the color filter layer pattern comprises color barriers having three colors, for example, red barrier, green barrier and blue barrier. In this case, the red, green and blue barriers are formed by three patterning processes. In an exemplary embodiment of the method, the second pattern missing region may exist in any one of the red, green and blue barriers. Hereafter, it will describe in detail an example of repairing the second pattern missing region occurred in red barrier, and the repairing process may comprise steps of:

Firstly, remove all patterns within the second pattern missing region from the substrate by laser processing the second pattern missing region of the substrate based on the position of the second pattern missing region;

Secondly, fill a second repair material into the second pattern missing region of the substrate processed by laser so as to repair the second pattern missing region. In an exemplary embodiment, the second repair material comprises a material adapted to form the red barrier in the color filter layer pattern.

In an exemplary embodiment of the present invention, the second pattern redundant region may exist in the red barrier, the green barrier or the blue barrier. After determining the second pattern redundant region and the position thereof in the color filter layer pattern, the above method may further comprise a step of removing all patterns within the second pattern redundant region from the substrate by laser processing the second pattern redundant region of the substrate based on the position of the second pattern redundant region.

According to another concept of the present invention, there is provided a display substrate made by the method according to the above embodiments of the present invention. Since the repairing method of the display substrate has been described in the above exemplary embodiments, its description is omitted hereafter.

According to another concept, there is provided a display apparatus comprising the above display substrate.

In an exemplary embodiment of the present invention, the display apparatus may comprise any product or member with a display function, such as, a liquid crystal panel, an organic light-emitting diode (OLED) panel, a mobile telephone, a panel computer, a TV, a display, a notebook computer, a digital photo frame, a navigating instrument, and so on. Since the repairing method of the display substrate of the display apparatus has been described in the above exemplary embodiments, its description is omitted hereafter.

In the method for repairing the display substrate, the display substrate and the display apparatus according to the above exemplary embodiments of the present invention, the color filter layer pattern is formed immediately after the black matrix pattern is formed on the substrate. Thereafter, all patterns within the first pattern missing region from the substrate are removed by laser processing the first pattern missing region of the black matrix pattern. Then, the first pattern missing region of the substrate processed by laser is filled with the first repair material. Thereby, the first repair material is confined between two adjacent color barriers in the formed color filter layer pattern, thereby preventing the first repair material from spreading into the aperture region of the substrate by properly controlling the filling amount of the first repair material. As a result, it not only eliminates the need for a step of clearing the redundant first repair material spread into the aperture region of the display substrate by laser, but also reduces the usage amount of the first repair material. Also, the surface of the black matrix pattern repaired by the above method becomes very flat, improving the display quality of the display panel.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A method for repairing a display substrate, comprising steps of:
   forming a black matrix pattern on a substrate, wherein there is a first pattern missed region in the formed black matrix pattern;
   detecting and marking the first pattern missed region and the position thereof in the black matrix pattern before the step of forming a color filter layer pattern on the substrate on which the black matrix pattern is formed;
   forming a color filter layer pattern on the substrate on which the black matrix pattern is formed;
   removing all patterns provided only within the first pattern missed region from the substrate by laser processing the first pattern missed region of the substrate based on a position of the first pattern missed region; and
   filling a first repair material only within the first pattern missed region of the substrate processed by laser so as to repair the first pattern missed region,
   wherein there is a first pattern redundant region in the formed black matrix pattern, and the method further comprising steps of:
   detecting and marking the first pattern redundant region and the position thereof in the black matrix pattern before the step of forming a color filter layer pattern on the substrate on which the black matrix pattern is formed; and
   removing all patterns provided within the first pattern redundant region from the substrate by laser processing the first pattern redundant region of the substrate based on a position of the first pattern redundant region,
   wherein the step of detecting and marking the first pattern missed region and the position thereof, and the step of detecting and marking the first pattern redundant region and the position thereof are simultaneously performed in one detection process,
   wherein the first pattern missed region includes a white defect region where at least part of the black matrix pattern is expected to be formed but is absent, and
   wherein the first repair material is filled only in an area surrounded by a boundary of the white defect region,
   wherein the first repair material filled in the first pattern missed region has a thickness equal to that of the black matrix pattern,
   wherein the first repair material filled in the first pattern missed region has an even thickness within the whole first pattern missed region, so that the repaired black matrix pattern has a flat surface.

2. The method according to claim 1, wherein there is a second pattern missed region in the formed color filter layer pattern, and the method further comprising steps of:
   detecting and marking the second pattern missed region and a position thereof in the color filter layer pattern;
   removing all patterns provided within the second pattern missed region from the substrate by laser processing the second pattern missed region of the substrate based on the position of the second pattern missed region; and
   filling a second repair material within the second pattern missed region of the substrate processed by laser so as to repair the second pattern missed region.

3. The method according to claim 2, wherein there is a second pattern redundant region in the formed color filter layer pattern, and the method further comprising steps of:
   detecting and marking the second pattern redundant region and a position thereof in the color filter layer pattern; and
   removing all patterns provided within the second pattern redundant region from the substrate by laser processing the second pattern redundant region of the substrate based on the position of the second pattern redundant region.

4. The method according to claim 3, wherein the step of detecting and marking the second pattern missed region and the position thereof, and the step of detecting and marking the second pattern redundant region and the position thereof are simultaneously performed in one detection process.

5. A display substrate manufactured by the method according to claim 1.

6. A display apparatus comprising the display substrate according to claim 5.

* * * * *